(12) United States Patent
Wan

(10) Patent No.: US 12,463,599 B2
(45) Date of Patent: Nov. 4, 2025

(54) AMPLIFICATION DEVICE

(71) Applicant: RichWave Technology Corp., Taipei (TW)

(72) Inventor: Kuang-Lieh Wan, Taipei (TW)

(73) Assignee: RichWave Technology Corp., Taipei (TW)

( * ) Notice: Subject to any disclaimer, the term of this patent is extended or adjusted under 35 U.S.C. 154(b) by 784 days.

(21) Appl. No.: 17/749,157

(22) Filed: May 20, 2022

(65) Prior Publication Data

US 2022/0376661 A1 Nov. 24, 2022

Related U.S. Application Data

(60) Provisional application No. 63/191,336, filed on May 21, 2021.

(51) Int. Cl.
*H03F 3/19* (2006.01)
*H03F 1/56* (2006.01)
*H03F 3/21* (2006.01)

(52) U.S. Cl.
CPC .............. *H03F 3/19* (2013.01); *H03F 1/56* (2013.01); *H03F 1/565* (2013.01); *H03F 3/211* (2013.01); *H03F 2200/105* (2013.01); *H03F 2200/387* (2013.01); *H03F 2200/451* (2013.01)

(58) Field of Classification Search
CPC ... H03F 3/19; H03F 1/56; H03F 1/565; H03F 3/211; H03F 2200/105; H03F 2200/387; H03F 2200/451

USPC ........................................................ 330/291
See application file for complete search history.

(56) References Cited

U.S. PATENT DOCUMENTS

| 7,911,235 B2 * | 3/2011 | Brown ..................... H03D 7/14 327/51 |
| 8,330,546 B2 | 12/2012 | Ripley |
| 8,710,925 B2 * | 4/2014 | Drogi ..................... H03F 3/189 330/297 |

(Continued)

OTHER PUBLICATIONS

Holdenried et al. (A DC-4-GHz True Logarithmic Amplifier: Theory and Implementation, published in IEEE Journal of Solid-State Circuits, vol. 37, No. IO, Oct. 2002, pp. 1290-1299. (Year: 2002).*

(Continued)

*Primary Examiner* — Hafizur Rahman
(74) *Attorney, Agent, or Firm* — Winston Hsu

(57) ABSTRACT

An amplification device includes an amplification unit, an impedance unit and a log power detector. The amplification unit includes an input terminal for receiving a radio-frequency signal, an output terminal for outputting an amplified radio-frequency signal, and a detected terminal for outputting a detected signal related to the radio-frequency signal. The impedance unit is used to provide an impedance. The impedance unit includes an input terminal coupled to the detected terminal of the amplification unit for receiving the detected signal, and an output terminal for outputting a power signal. The log power detector is used to generate a power indication signal according to the power signal. The log power detector includes an input terminal coupled to the output terminal of the impedance unit, and an output terminal for outputting the power indication signal.

19 Claims, 16 Drawing Sheets

(56) References Cited

U.S. PATENT DOCUMENTS

| | | | |
|---|---|---|---|
| 8,810,285 B2* | 8/2014 | Shimamune | H03F 3/245 330/285 |
| 11,349,512 B1 | 5/2022 | Eken | |
| 11,894,814 B2 | 2/2024 | Krivokapic | |
| 2004/0263249 A1* | 12/2004 | Leffel | H03F 1/3229 330/149 |
| 2008/0180169 A1 | 7/2008 | Ripley | |
| 2014/0287704 A1* | 9/2014 | Dupuy | H04B 1/18 455/114.2 |
| 2018/0191305 A1* | 7/2018 | Chien | G01R 19/0092 |

OTHER PUBLICATIONS

Wan, the specification, including the claims, and drawings in the U.S. Appl. No. 17/749,159, filed May 20, 2022.

Office action mailed on Jan. 9, 2023 for the Taiwan application No. 111118932, filing date May 20, 2022, pp. 1-7.

Current to Voltage Converter—Applications, Sep. 4, 2020 by Electricalvoice ,2020.

Office action mailed on Mar. 31, 2025 for the U.S. Appl. No. 17/749,159, filed May 20, 2022, p. 1-23 ,2022.

* cited by examiner

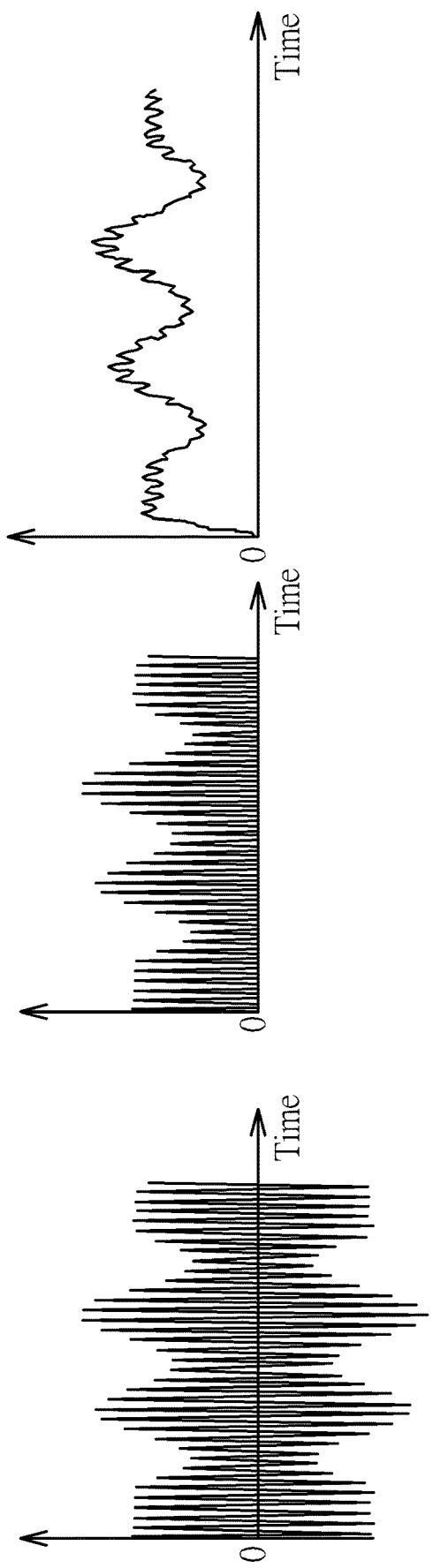

AMPLIFICATION DEVICE

CROSS REFERENCE TO RELATED APPLICATION

This application claims the benefit of U.S. Provisional Application No. 63/191,336, filed on May 21, 2021. The content of the application is incorporated herein by reference.

TECHNICAL FIELD

The disclosure is related to an amplification device for reducing loading effect, and more particularly, an amplification device for reducing loading effect by providing a suitable impedance.

BACKGROUND

In order to detect the power of a signal inputted to a set of power amplifiers, a coupler can be coupled to the set of power amplifiers, and a log power detector can be coupled to the coupler. The output signal of the log detector can be related to the input signal of the set of power amplifiers, so the output signal of the log detector can be used to indicate the power of the input signal of the set of power amplifiers. This circuit structure is practicable, however, the coupler will increase the insertion loss and be detrimental to the signal quality.

In another circuit structure, a log power detector can be directly coupled to a set of power amplifiers, and the output signal of the log detector can be used for indicating the power of the input signal of the set of power amplifiers. However, the loading effect caused by the log power detector will worsen the linearity between the input signal of the set of power amplifiers and the output signal of the log detector, so it is difficult to measure the power of the input signal of the set of power amplifiers by measuring the output signal of the log detector.

SUMMARY

An embodiment provides an amplification device. The amplification device comprises an amplification unit, an impedance unit and a log power detector. The amplification unit comprises an input terminal configured to receive a radio-frequency signal, an output terminal configured to output an amplified radio-frequency signal, and a detected terminal configured to output a detected signal related to the radio-frequency signal. The impedance unit is configured to provide an impedance. The impedance unit comprises an input terminal coupled to the detected terminal of the amplification unit and configured to receive the detected signal, and an output terminal configured to output a power signal. The log power detector is configured to generate a power indication signal according to the power signal. The log power detector comprises an input terminal coupled to the output terminal of the impedance unit, and an output terminal configured to output the power indication signal. The log power detector has a parallel structure.

Another embodiment provides an amplification device, and the amplification device comprises an amplification unit, an impedance unit and a log power detector. The amplification unit comprises an input terminal configured to receive a radio-frequency signal, an output terminal configured to output an amplified radio-frequency signal, and a detected terminal configured to output a detected signal related to the radio-frequency signal. The impedance unit is configured to provide an impedance. The impedance unit comprises an input terminal coupled to the detected terminal of the amplification unit and configured to receive the detected signal, and an output terminal configured to output a power signal. The log power detector is configured to generate a power indication signal according to the power signal. The log power detector comprises an input terminal coupled to the output terminal of the impedance unit, and an output terminal configured to output the power indication signal. The log power detector has a cascade structure.

BRIEF DESCRIPTION OF THE DRAWINGS

FIG. 14, FIG. 15 and FIG. 16 illustrate waveforms of a signal processed by the impedance unit of FIG. 2 according to an embodiment.

DETAILED DESCRIPTION

Figure 1:
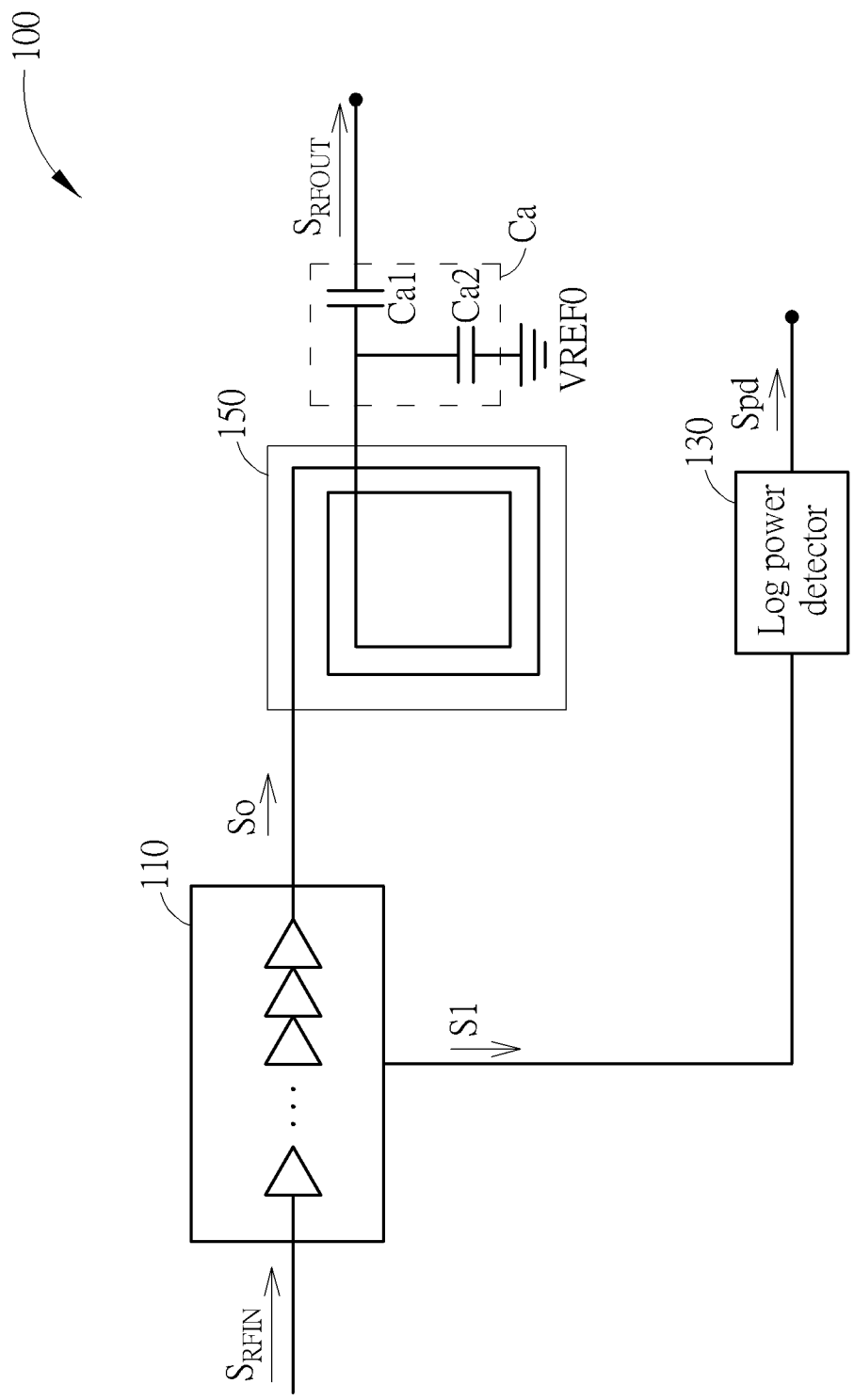
FIG. 1 illustrates an amplification device according to an embodiment.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

FIG. 1 illustrates an amplification device 100 according to an embodiment. The amplification device 100 can include an amplification unit 110 and a log power detector 130. As shown in FIG. 1, the amplification unit 110 can include an input terminal, an output terminal and a detected terminal, where the input terminal is used to receive a radio-frequency signal $S_{RFIN}$, the output terminal is used to output an amplified radio-frequency signal So, and the detected terminal is used to output a detected signal S1 related to the radio-frequency signal $S_{RFIN}$. The log power detector 130 is used to generate a power indication signal Spd according to the detected signal S1. The log power detector 130 can include an input terminal and an output terminal, where the input terminal is coupled to the detected terminal of the amplification unit 110, and an output terminal configured to output the power indication signal Spd. In one embodiment, the input terminal of the log power detector 130 can be considered to couple to a resistance for reducing loading effect. However, considering the resolution in the low-power domain, the resistance may be omitted. In one embodiment, the amplification device 100 can further include a matching circuit 150 (e.g. matching inductor) coupled to the output terminal of the amplification unit 110.

Figure 2:
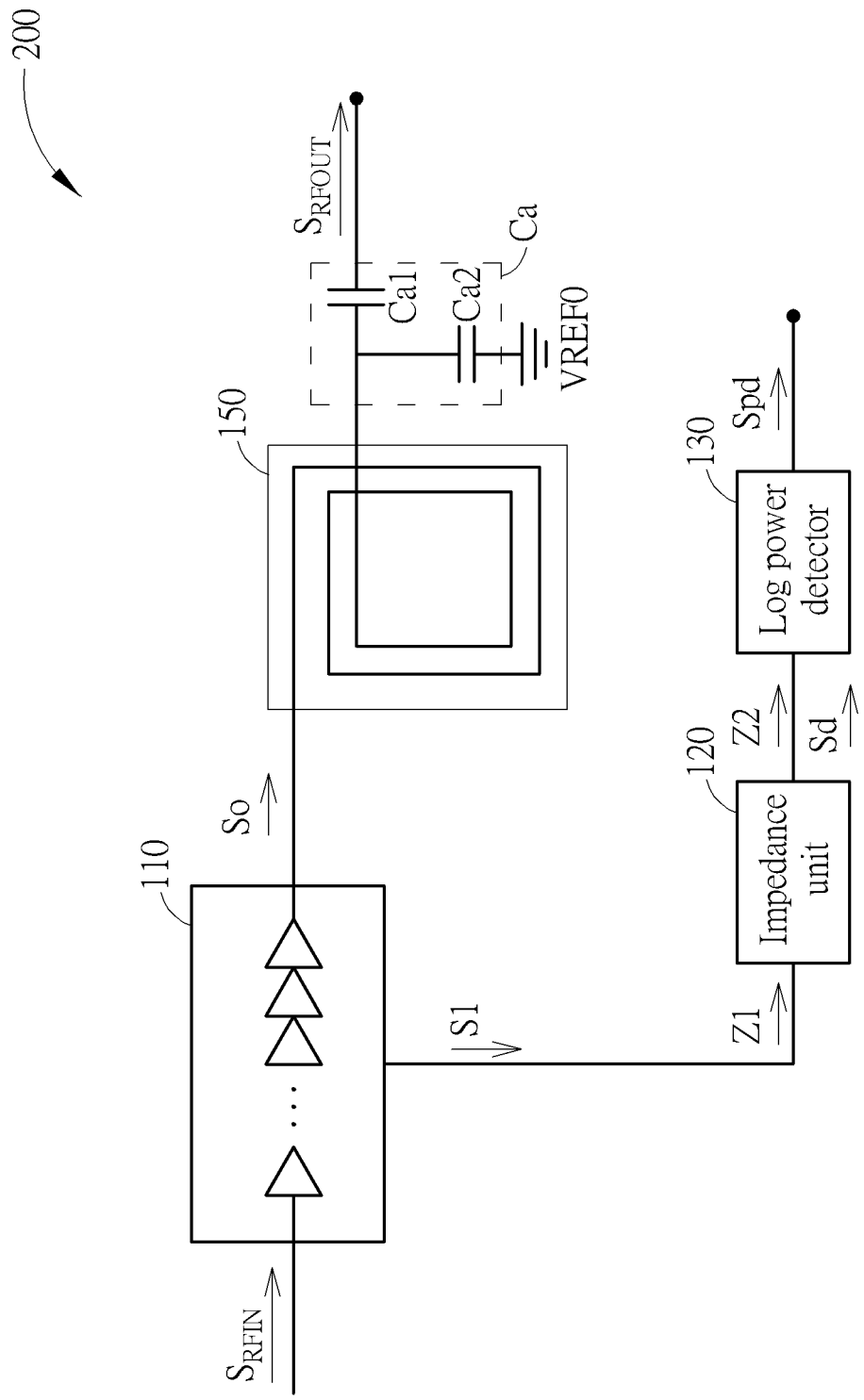
FIG. 2 illustrates an amplification device according another embodiment.

FIG. 2 illustrates an amplification device 200 according to another embodiment. The amplification device 200 can be similar to the amplification device 100 of FIG. 1, however, the amplification device 200 can further include an impedance unit 120. The impedance unit 120 is used to provide a predetermined impedance. As shown in FIG. 2, the impedance unit 120 can include an input terminal and an output terminal, where the input terminal is coupled to the detected terminal of the amplification unit 110 and used to receive the detected signal S1, and the output terminal is used to output a power signal Sd to the input terminal of the log power detector 130. In FIG. 2, the log power detector 130 can generate the power indication signal Spd according to the power signal Sd.

In one embodiment, an impedance of the impedance unit 120 can be 5 to 7 times an impedance of the amplification unit 110.

In one embodiment, in FIG. 2, an impedance Z1 looking towards the input terminal of the impedance unit 120 can be higher than another impedance Z2 looking towards the input terminal of the log power detector 130.

According to an embodiment, the log power detector 130 can have a parallel structure. According to another embodiment, the log power detector 130 can have a cascade structure. The parallel structure and the cascade structure will be described below.

In one embodiment, the log power detector 130 of the amplification device 100 of FIG. 1 can have a cascade structure. If the log power detector 130 has a cascade structure, the impedance looking towards the log power detector 130 from the amplification unit 110 would not be too low, so the amplification device does not need to have the impedance unit 120 as shown in FIG. 1.

In one embodiment, The log power detector 130 of the amplification device 200 of FIG. 2 can have a parallel structure or a cascade structure. If the log power detector 130 has a parallel structure, the impedance looking towards the log power detector 130 from the amplification unit 110 may be too low. This may cause loading effect, so the impedance unit 120 can be implemented as shown in FIG. 2. In another embodiment, if the log power detector 130 has a cascade structure, the impedance unit 120 can still be used for adjusting impedance, as shown in FIG. 2.

As shown in FIG. 1 and FIG. 2, a matching circuit 150 (e.g. matching inductor) can be coupled to the output terminal of the amplification unit 110 for outputting an output signal $S_{RFOUT}$ related to the radio-frequency signal $S_{RFIN}$. For example, the output signal $S_{RFOUT}$ can be processed to obtain the information carried by the radio-frequency signal $S_{RFIN}$. As shown in FIG. 1 and FIG. 2, a set of capacitors Ca can be used to block the DC (direct-current) portion of the signal. The set of capacitors Ca can be coupled to the output terminal of the matching circuit 150. In one embodiment, the set of capacitors Ca include a first capacitor Ca1 and a second capacitor Ca2. The first capacitor Ca1 can be coupled to the matching circuit 150 and includes a first terminal to receive the output signal $S_{RFOUT}$. The second capacitor Ca2 includes a first terminal for receiving a reference voltage VREF0 and a second terminal coupled to the matching circuit 150. The reference voltage VREF0 can be a ground voltage. However, the invention is not limited thereto.

The amplification unit 110 can further include n amplifiers coupled in series, and n is an integer larger than 1. In the amplification unit 110, the output terminal of an $i^{th}$ amplifier can be coupled to an input terminal of the $(i+1)^{th}$ amplifier, where i is an integer, and 0<i<n. The input terminal of the first amplifier of the n amplifiers can be the input terminal of the amplification unit 110. The output terminal of the $n^{th}$ amplifier of the n amplifiers can be the output terminal of the amplification unit 110. One of the input terminal and the output terminal of the $n^{th}$ amplifier of the n amplifiers can be the detected terminal of the amplification unit 110. In one embodiment, the output terminal of the amplifier of the last stage or the output terminal of the amplifier of the penultimate stage can be the detected terminal of the amplification unit 110. However, the invention is not limited thereto.

In FIG. 2, the detected terminal of the amplification unit 110 can be electrically connected to the input terminal of the impedance unit 120 directly through a conductive path. The conductive path can include at least one of a conductive wire, a metal path and a conductive trace. The impedance unit 120 can include a diode. The impedance unit 120 can include a phase shifter. For example, the phase shifter of the impedance unit 120 can include a set of passive components and/or a set of attenuators for shifting the phase on the Smith chart to adjust the impedance. By using the impedance unit 120, for the amplification unit 110, the impedance looking towards the impedance unit 120 can be increased and adjusted, improving the linearity related to the amplification unit 110.

Figure 3:
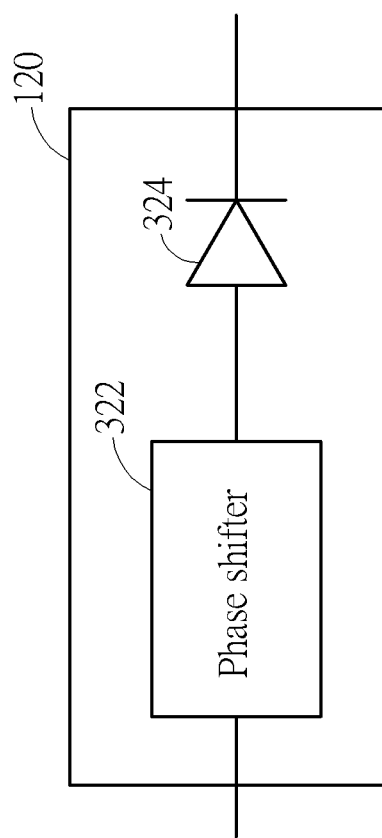
FIG. 3 illustrates the impedance unit of FIG. 2 according to an embodiment.

FIG. 3 illustrates the impedance unit 120 according to an embodiment. As shown in FIG. 3, the impedance unit 120 can include a phase shifter 322 and a diode 324 coupled in series. As shown in FIG. 3, an input terminal of the phase shifter 322 can be coupled to the input terminal of the impedance unit 120. An output terminal of the phase shifter 322 can be coupled to an input terminal of the diode 324. An output terminal of the diode 324 can be coupled to the output terminal of the impedance unit 120.

Figure 4:
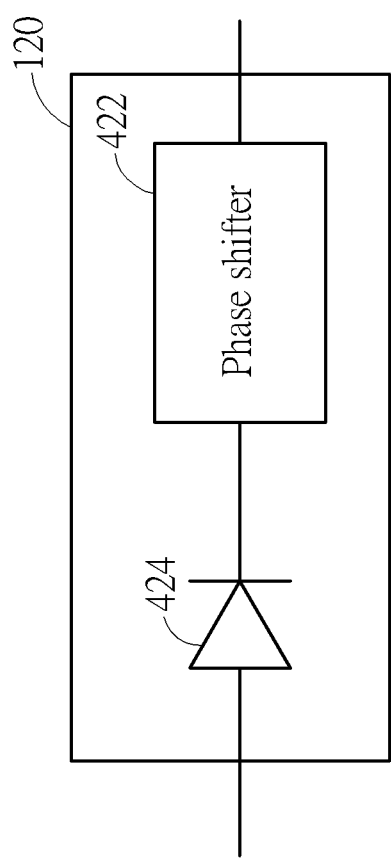
FIG. 4 illustrates the impedance unit of FIG. 2 according to another embodiment.

FIG. 4 illustrates the impedance unit 120 according to another embodiment. As shown in FIG. 4, the impedance unit 120 can include a phase shifter 422 and a diode 424 coupled in series. As shown in FIG. 4, an input terminal of the diode 424 can be coupled to the input terminal of the impedance unit 120. An output terminal of the diode 424 can be coupled to an input terminal of the phase shifter 422. An output terminal of the phase shifter 422 can be coupled to the output terminal of the impedance unit 120.

Figure 5:
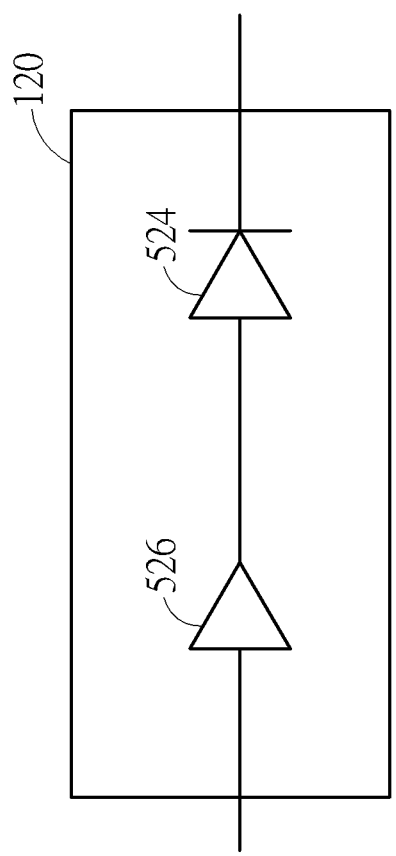
FIG. 5 illustrates the impedance unit of FIG. 2 according to another embodiment.

FIG. 5 illustrates the impedance unit 120 according to another embodiment. As shown in FIG. 5, the impedance unit 120 can include an amplifier 526 and a diode 524 coupled in series. As shown in FIG. 5, an input terminal of the amplifier 526 can be coupled to the input terminal of the impedance unit 120. An output terminal of the amplifier 526 can be coupled to an input terminal of the diode 524. An output terminal of the diode 524 can be coupled to the output terminal of the impedance unit 120.

Figure 6:
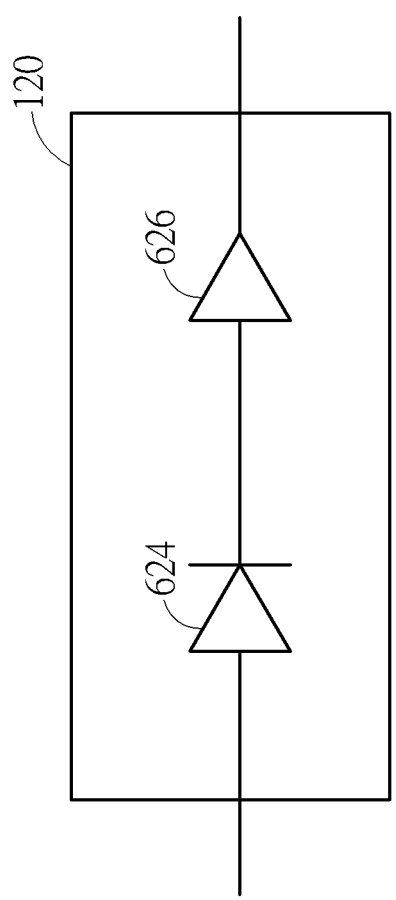
FIG. 6 illustrates the impedance unit of FIG. 2 according to another embodiment.

FIG. 6 illustrates the impedance unit 120 according to another embodiment. As shown in FIG. 6, the impedance unit 120 can include a diode 624 and an amplifier 626 coupled in series. As shown in FIG. 6, an input terminal of the diode 624 can be coupled to the input terminal of the impedance unit 120. An output terminal of the diode 624 can be coupled to an input terminal of the amplifier 626. An output terminal of the amplifier 626 can be coupled to the output terminal of the impedance unit 120.

Figure 7:
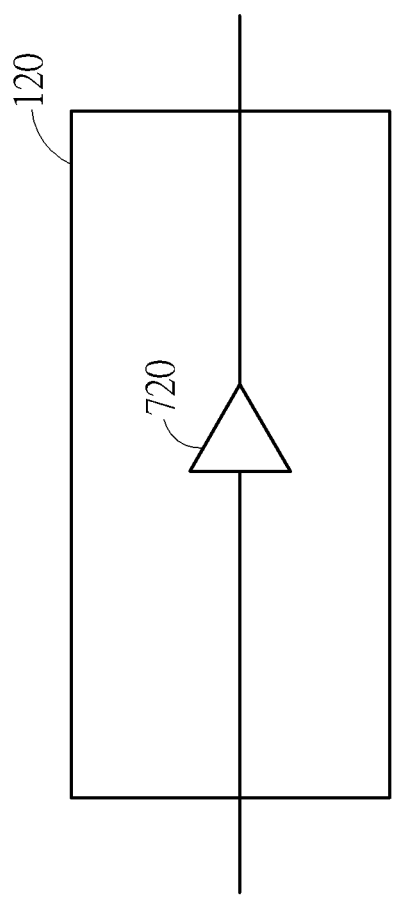
FIG. 7 illustrates the impedance unit of FIG. 2 according to another embodiment.

FIG. 7 illustrates the impedance unit 120 according to another embodiment. As shown in FIG. 7, the impedance unit 120 can include an amplifier 720. The amplifier 720 can include an input terminal coupled to the input terminal of the impedance unit 120, and an output terminal coupled to the output terminal of the impedance unit 120. In one embodiment, the amplifier 720 can be a unity-gain amplifier operated as a buffer. However, the invention is not limited thereto.

Figure 8:
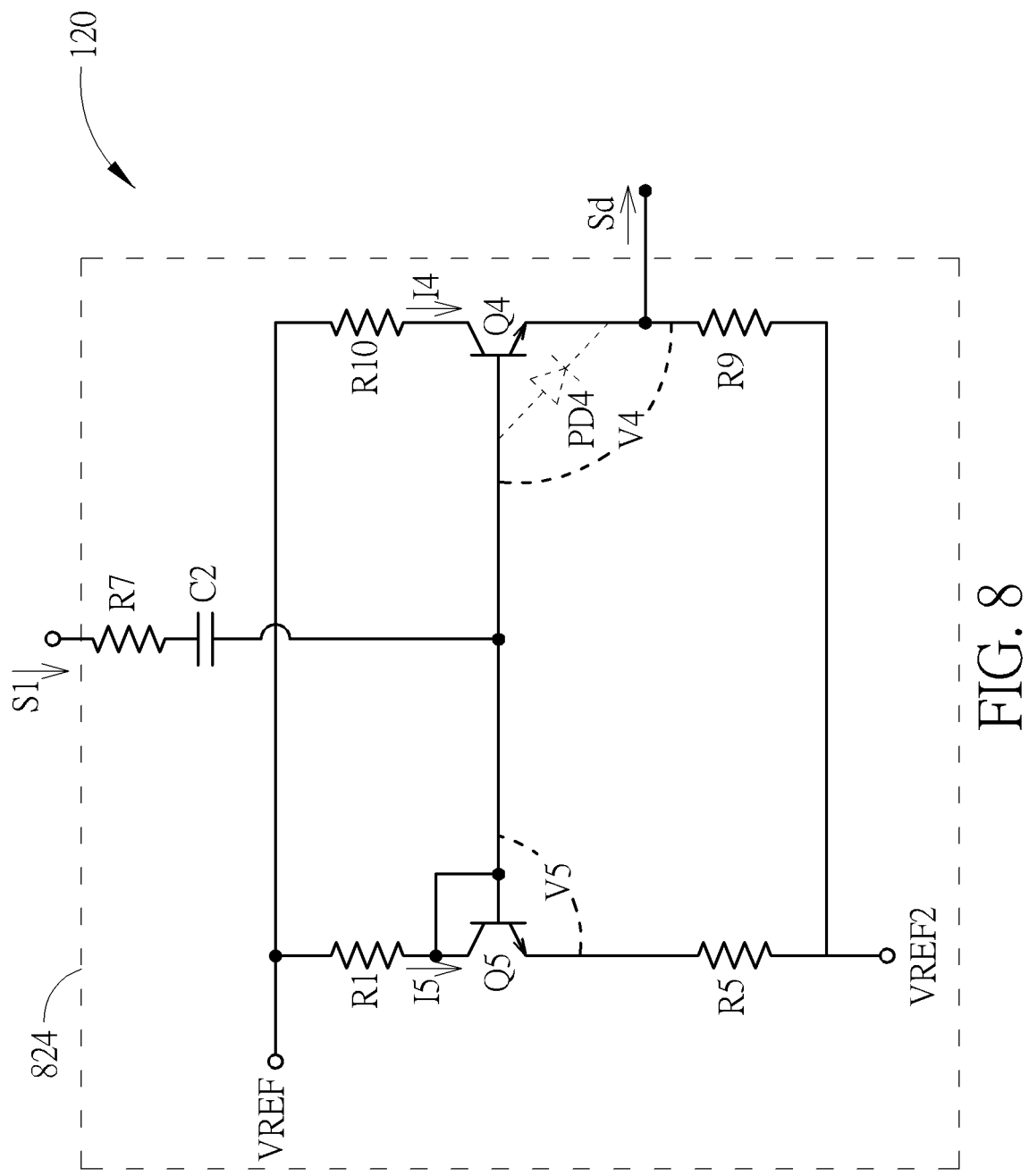
FIG. 8 illustrates the impedance unit of FIG. 2 according to another embodiment.

FIG. 8 illustrates the impedance unit 120 according to another embodiment. As shown in FIG. 8, the impedance 120 can include a diode 824 including a transistor Q4 and a transistor Q5. The transistor Q5 can include a first terminal, a second terminal, and a control terminal. The control terminal of the transistor Q5 coupled to the first terminal of the first transistor Q5. The transistor Q4 can include a first terminal, a second terminal, and a control terminal coupled to the control terminal of the transistor Q5 and the input terminal of the diode 824.

The output terminal of the diode 824 of the impedance unit 120 can be coupled to one of the first terminal and the second terminal of the transistor Q4. In FIG. 8, the output terminal of the diode 824 is coupled to the second terminal of the transistor Q4, and a parasitic diode PD4 formed between the control terminal and the second terminal of the transistor Q4 is used to function as a diode and a rectifier. Conversely, a parasitic diode formed between the first terminal and the control terminal of the transistor Q4 is used to function as a diode if the output terminal of the diode 824 of the impedance unit 120 is coupled to the first terminal of the transistor Q4. Each of the transistor Q5 and the transistor Q4 can be a bipolar transistor or a metal-oxide-semiconductor field-effect transistor.

As shown in FIG. 8, the diode 824 of the impedance unit 120 can further include a resistor R1, a resistor R5, a resistor R10, a resistor R9 and a capacitor C2. The resister R1 includes a first terminal for receiving a reference voltage VREF, and a second terminal coupled to the first terminal of the transistor Q5. The resistor R5 includes a first terminal coupled to the second terminal of the transistor Q5, and a second terminal for receiving a reference voltage VREF2. The reference voltage VREF2 can be a ground voltage. The resistor R10 includes a first terminal coupled to the first terminal of the resistor R1, and a second terminal coupled to the first terminal of the transistor Q4. The resistor R9 includes a first terminal coupled to the second terminal of the transistor Q4, and a second terminal. The second terminal of the resistor R9 can be coupled to the second terminal of the resistor R5. The capacitor C2 includes a first terminal coupled to the input terminal of the diode 824 of the impedance unit 120, and a second terminal coupled to the control terminal of the transistor Q4. The diode 824 of the impedance unit 120 can optionally include a resistor R7. The resistor R7 can include a first terminal coupled to the input terminal of the diode 824 of the impedance unit 120, and a second terminal coupled to the first terminal of the capacitor C2. Each of the diode 324, diode 424, diode 524 and diode 624 mentioned above can have the structure of the diode 824 in FIG. 8. However, the invention is not limited thereto.

Regarding FIG. 8, the impedance unit 120 can perform temperature compensation to stabilize the power signal Sd when temperature varies. For example, in FIG. 8, the voltages V4 and V5 (e.g. base-emitter voltages of the transistors Q4 and Q5) can be equal to one another, and it can be expressed as V4=V5. When the temperature rises, the voltages V5 and V4 will decrease. The current I5 flowing through the first terminal of the transistor Q5 can be expressed as I5=(VREF−V5−VREF2)÷(R1+R5). The reference voltage VREF is constant. The transistors Q5 and Q4 can form a current mirror, so a current I4 flowing through the first terminal of the transistor Q4 can be expressed as I4=I5. Here, the current on the control terminals of the transistors Q5 and Q4 can be ignored for simplicity. As shown in FIG. 8, the voltage level of the power signal Sd can be a product of the current I4 and the resistance of the resistor R9, and be expressed as I4×R9. When the current I4 increases, the voltage drop across the resistor R9 increases, and the voltage level of the power signal Sd is increased. The increase of the voltage level of the power signal Sd compensates the decrease of the voltage level of the power signal Sd when temperature rises. In other words, the temperature compensation is performed to stabilize the power signal Sd when temperature varies. Since the impedance unit 120 can perform temperature compensation to stabilize the power signal Sd, the power indication signal Spd (shown in FIG. 2) can be stabilized.

Figure 9:
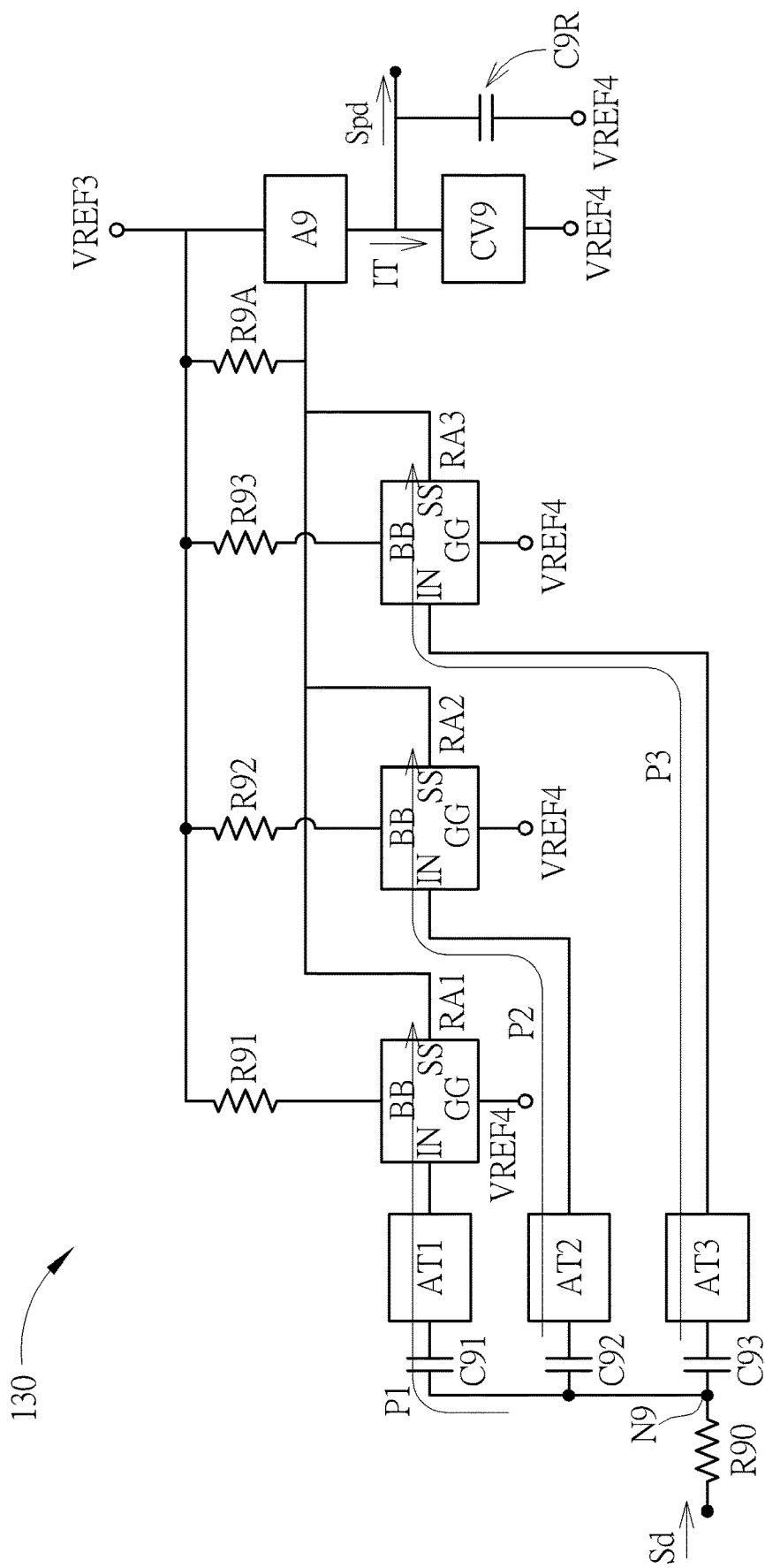
FIG. 9 illustrates a structure of the abovementioned log power detector according to an embodiment.

FIG. 9 illustrates a structure of the abovementioned log power detector 130 according to an embodiment. The structure of FIG. 9 is a parallel structure. As shown in FIG. 9, the log power detector 130 can include at least a first attenuation circuit AT1, a first operation unit RA1, a second attenuation circuit AT2 and a second operation unit RA2. In one embodiment, the log power detector 130 can further include a third attenuation circuit AT3 and a third operation unit RA3. However, the invention is not limited thereto.

Each of the first attenuation circuit AT1 and the second attenuation circuit AT2 can include a first terminal and a second terminal. Each of the first operation unit RA1 and the second operation unit RA2 can include a first terminal IN, a second terminal SS, a third terminal BB and a fourth terminal GG.

The first attenuation circuit AT1 can be used to attenuate the power signal Sd in a first power range. Regarding the first attenuation circuit AT1, the first terminal is coupled to the input terminal of the log power detector 130.

Regarding the first operation unit RA1, the first terminal IN can be coupled to the second terminal of the first attenuation circuit AT1.

The second attenuation circuit AT2 can be used to attenuate the power signal Sd in a second power range. Regarding the second attenuation circuit AT2, the first terminal IN can be coupled to the input terminal of the log power detector 130.

Regarding the second operation unit RA2, the first terminal IN can be coupled to the second terminal of the second attenuation circuit AT2.

A plurality of paths P1, P2 can be respectively set between two nodes to become the parallel structure. In one embodiment, the parallel structure of the log power detector 130 can include at least the first attenuation circuit AT1, the first operation unit RA1, the second attenuation circuit AT2 and the second operation unit RA2. As shown in FIG. 9, a path P1 related to the first attenuation circuit AT1 and the first operation unit RA1 can be coupled between the node N9 and an adder A9, and a path P2 related to the second attenuation circuit AT2 and the second operation unit RA2 can also be coupled between the node N9 and the adder A9. Hence, the path P1 and the path P2 can be of the parallel structure with respect to the node N9. However, the invention is not limited thereto.

In addition to the attenuation circuits AT1 and AT2 and the operation units RA1 and RA2, the parallel structure of the log power detector 130 can be expanded to include more attenuation circuit(s) and operation unit(s). For example, as shown in FIG. 9, the log power detector 130 can further include a third attenuation circuit AT3 and a third operation unit RA3 to form a path P3. The path P3 can be in parallel with the path P1 and the path P2 with respect to the node N9. In addition to the attenuation circuits AT1 and AT2, the third attenuation circuit AT3 can be used to attenuate the power signal Sd in a third power range.

The first power range, the second power range and the third power range can form a power range in which the power of the radio-frequency signal $S_{RFIN}$ (shown in FIG. 1 and FIG. 2) can be detected by means of the power indication signal Spd generated by the log power detector 130.

Figure 18:
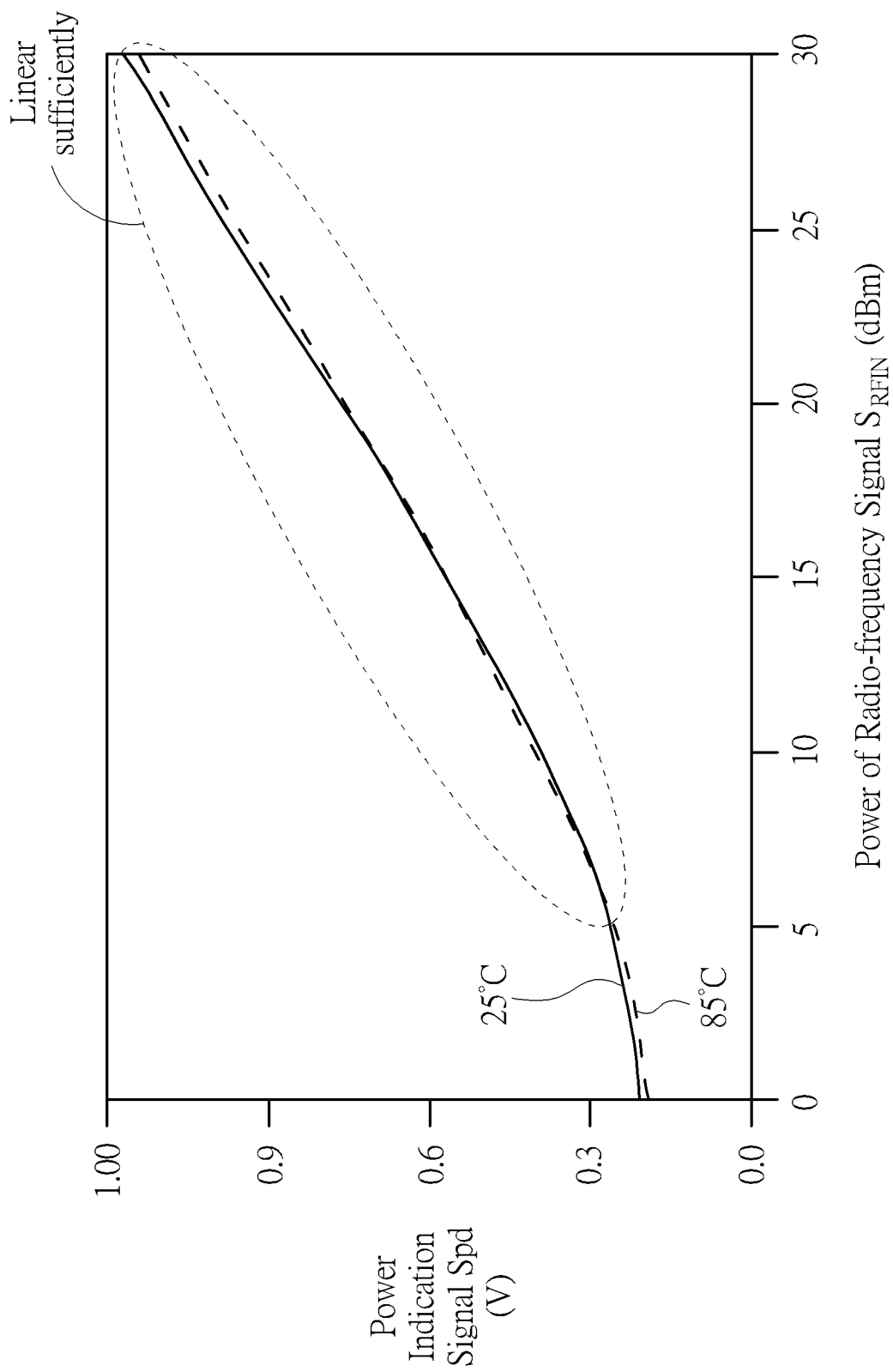
FIG. 18 illustrates a curve diagram according to an embodiment.

For example, the first power range can be 5 to 15 dBm (decibel-milliwatts), the second power range can be 15 to 20 dBm, and the third power range can be 20 to 30 dBm. The power range formed by the first power range, the second power range and the third power range can be 5 to 30 dBm. In this example, the power of the radio-frequency signal $S_{RFIN}$ can be detected according to the power indication signal Spd when the power of the radio-frequency signal $S_{RFIN}$ is within the power range of 5 to 30 dBm. The power indication signal Spd is positively and linearly related to the power of the radio-frequency signal $S_{RFIN}$ in the power range (e.g. 5 to 30 dBm) as shown in the example of FIG. 18 mentioned below.

As shown in FIG. 9, a resistor R90 can be optionally used and coupled to the input terminal of the log power detector 130 and the node N9 and be used to adjust the intensity of the signal. A capacitor C91 can be coupled to the node N9 and the attenuation circuit AT1 to block a DC portion of the signal. Likewise, a capacitor C92 can be coupled to the node N9 and the attenuation circuit AT2 to block a DC portion of the signal, and a capacitor C93 can be coupled to the node N9 and the attenuation circuit AT3 to block a DC portion of the signal.

In one embodiment, each of the attenuation circuits AT1, AT2 and AT3 can include a resistor, and the resistor includes a first terminal and a second terminal respectively coupled to the first terminal and the second terminal of the corresponding attenuation circuit. However, the invention is not limited thereto.

As shown in FIG. 9, a resistor R91 can include a first terminal and a second terminal, where the first terminal receives a reference voltage VREF3, and the second terminal can be coupled to the third terminal BB of the first operation unit RA1. The resistor R91 can be a bias resistor for generating a bias voltage for the first operation unit RA1.

Likewise, a resistor R92 can include a first terminal and a second terminal, where the first terminal receives the reference voltage VREF3, and the second terminal can be coupled to the third terminal BB of the second operation unit RA2. The resistor R92 can be a bias resistor used to generate a bias voltage for the second operation unit RA2. A resistor R93 can receive the reference voltage VREF3 and be coupled to the third terminal BB of the third operation unit RA3 to generate a bias voltage for the third operation unit RA3.

As shown in FIG. 9, the fourth terminal GG of each of the operation units RA1, RA2 and RA3 can be used to receive a reference voltage VREF4. For example, the reference voltage VREF4 can be a ground voltage.

The operation units of the log power detector 130 (e.g. RA1, RA2 and RA3 in FIG. 9) can form a rectifying and amplifying circuit to rectify and amplify signals.

As show in FIG. 9, the log power detector 130 can further include an adder A9 and a current-to-voltage circuit CV9.

The adder A9 can include a first terminal, a second terminal and a control terminal, where the first terminal is used to receive a supply voltage (e.g. the reference voltage VREF3), the second terminal is used to output a result signal IT, and the control terminal is coupled to the second terminals SS of the operation units RA1 and RA2. In one embodiment, the control terminal of the adder A9 is coupled to the second terminals SS of the operation units RA1, RA2 and RA3.

The current-to-voltage circuit CV9 is used to convert the result signal IT to generate the power indication signal Spd. The current-to-voltage circuit CV9 can include a first terminal and a second terminal, where the first terminal is coupled to the second terminal of the adder A9 and the output terminal of the log power detector 130, and a second terminal can receive a reference voltage (e.g. the reference voltage VREF4). The result signal IT can be a current signal, and the power indication signal Spd can be a voltage signal.

As shown in FIG. 9, the log power detector 130 can further include a capacitor C9R including a first terminal and a second terminal, where the first terminal is coupled to the output terminal of the log power detector 130, and the second terminal receives a reference voltage (e.g. the reference voltage VREF4). The capacitor C9R can be a rectification component.

Figure 10:
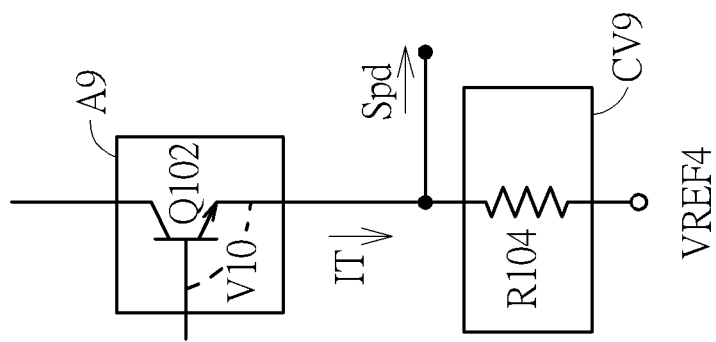
FIG. 10 illustrates a portion of the log power detector of FIG. 9 according to an embodiment.

FIG. 10 illustrates a portion of the log power detector 130 of FIG. 9 according to an embodiment. In FIG. 10, the adder A9 and the current-to-voltage circuit CV9 are illustrated. As shown in FIG. 10, the adder A9 can include a transistor Q102. The transistor Q102 can include a first terminal, a second terminal and a control terminal, where the first terminal is coupled to the first terminal of the adder A9, the second terminal is coupled to the second terminal of the adder A9, and the control terminal is coupled to the control terminal of the adder A9. The current-to-voltage circuit CV9 can include a resistor R104. The resistor R104 can include a first terminal and a second terminal, where the first terminal is coupled to the first terminal of the current-to-voltage circuit CV9, and the second terminal is coupled to the second terminal of the current-to-voltage circuit CV9.

Regarding FIG. 9 and FIG. 10, the log power detection 130 can perform temperature compensation to stabilize the power indication signal Spd. The relationship of the result signal IT (e.g. a current signal) and the voltage V10 (e.g. a base-emitter voltage of the transistor Q102) can approximate a current-voltage (i.e. I-V) characteristic of a diode. Hence, when the temperature increases, the voltage V10 decreases, and the result signal IT increases. Since the power indication signal Spd (e.g. a voltage signal) can approximate a product of the result signal IT and a resistance of the resistor R104, a larger result signal IT leads to a larger voltage drop across the resistor R104. Hence, the increase of the voltage level of the power indication signal Spd compensates the decrease of the voltage level of the power indication signal Spd when temperature rises. In other words, the temperature compensation is performed to stabilize the power indication signal Spd when the temperature varies.

Figure 11:
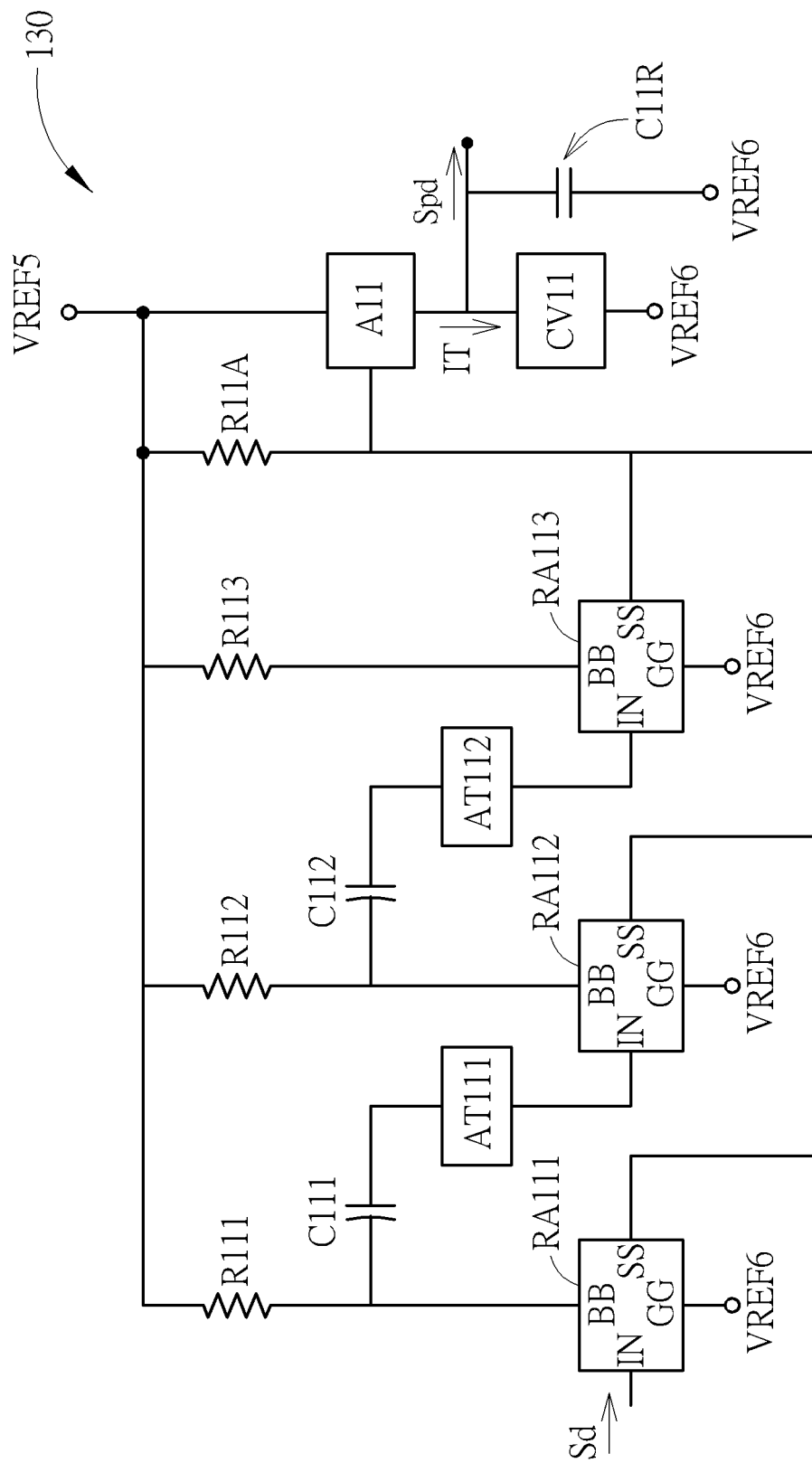
FIG. 11 illustrates a structure of the abovementioned log power detector according to another embodiment.

FIG. 11 illustrates a structure of the abovementioned log power detector 130 according to another embodiment. The structure of FIG. 11 is a cascade structure. As shown in FIG.

11, the cascade structure of the log power detector 130 can include the first operation unit RA111, the first attenuation circuit AT111 and the second operation unit RA112. As shown in FIG. 11, the cascade structure of the log power detector 130 can further include more attenuation circuit(s) and operation unit(s) such as the second attenuation circuit AT112 and the third operation unit RA113. However, the invention is not limited thereto.

As shown in FIG. 11, each of the first attenuation circuit AT111 and the second attenuation circuit AT112 can include a first terminal and a second terminal. Each of the first operation unit RA111, the second operation unit RA112 and the third operation unit RA113 can include a first terminal IN, a second terminal SS, a third terminal BB and a fourth terminal GG.

As shown in FIG. 11, regarding the first operation unit RA111, the first terminal IN can be coupled to the input terminal of the log power detector 130. Regarding the first attenuation circuit AT111, the first terminal can be coupled to the third terminal BB of the first operation unit RA111. Regarding the second operation unit RA112, the first terminal IN can be coupled to the second terminal of the first attenuation circuit AT111. Regarding the second attenuation circuit AT112, the first terminal can be coupled to the third terminal BB of the second operation unit RA112. Regarding the third operation unit RA113, the first terminal IN can be coupled to the second terminal of the second attenuation circuit AT112.

As shown in FIG. 11, the log power detector 130 can further include resistors R111, R112, R113 and R11A. Regarding the resistor R111, a first terminal can receive a reference voltage VREF5, and a second terminal can be coupled to the third terminal BB of the first operation unit RA111. Regarding the resistor R112, a first terminal can receive the reference voltage VREF5, and a second terminal can be coupled to the third terminal BB of the second operation unit RA112. Regarding the resistor R113, a first terminal can receive the reference voltage VREF5, and a second terminal can be coupled to the third terminal BB of the third operation unit RA113. The resistors R111, R112 and R113 can be bias resistors for generating bias voltages for the operation units RA111, RA112 and RA113.

As shown in FIG. 11, the log power detector 130 can further include capacitors C111 and C112. The capacitor C111 can include a first terminal coupled to the third terminal BB of the first operation unit RA111, and a second terminal coupled to the first terminal of the first attenuation circuit AT111. The capacitor C112 can include a first terminal coupled to the third terminal BB of the second operation unit RA112, and a second terminal coupled to the first terminal of the second attenuation circuit AT112.

In one embodiment, each of the attenuation circuits AT111 and AT112 can include a resistor, and the resistor includes a first terminal and a second terminal respectively coupled to the first terminal and the second terminal of the corresponding attenuation circuit. However, the invention is not limited thereto.

As shown in FIG. 11, the log power detector 130 can further include a resistor R11A, an adder A11 and a current-to-voltage circuit CV11. The resistor R11A can include a first terminal receiving the reference voltage VREF5, and a second terminal coupled to the second terminal SS of the third operation unit RA113 and a control terminal of the adder A11. The resistor R11A can be a bias resistor used to generate a bias voltage for the adder A11. The adder A11 can have a first terminal, a second terminal and the control terminal, where the first terminal is used to receive a supply voltage (e.g. the reference voltage VREF5), the second terminal is used to output a result signal IT, and the control terminal is coupled to the second terminals SS of the operation units RA111, RA112 and RA113. The current-to-voltage circuit CV11 is used to convert the result signal IT to generate the power indication signal Spd. The current-to-voltage circuit CV11 can include a first terminal and a second terminal, where the first terminal is coupled to the second terminal of the adder A11 and the output terminal of the log power detector 130, and the second terminal can receive a reference voltage VREF6. For example, the reference voltage VREF6 can be a ground voltage. For example, the result signal IT can be a current signal, and the power indication signal Spd can be a voltage signal.

As shown in FIG. 11, the log power detector 130 can further include a capacitor C11R including a first terminal and a second terminal, where the first terminal is coupled to the output terminal of the log power detector 130, and the second terminal receives a reference voltage (e.g. the reference voltage VREF6). The capacitor C11R can be a rectification component.

Figure 12:
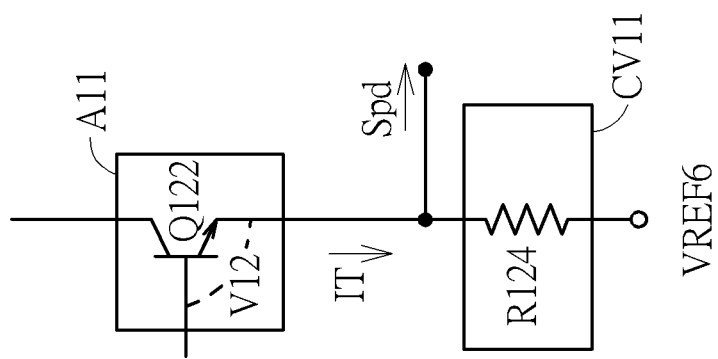
FIG. 12 illustrates a portion of the log power detector of FIG. 11 according to an embodiment.

FIG. 12 illustrates a portion of the log power detector 130 of FIG. 11 according to an embodiment. As shown in FIG. 12, the adder A11 can include a transistor Q122. The transistor Q122 can include a first terminal, a second terminal and a control terminal respectively coupled to the first terminal, the second terminal and the control terminal of the adder A11. The current-to-voltage circuit CV11 can include a resistor R124. The resistor R124 can include a first terminal and a second terminal respectively coupled to the first terminal and the second terminal of the current-to-voltage circuit CV11.

Regarding FIG. 11 and FIG. 12, the log power detection 130 can perform temperature compensation. The relationship of the result signal IT (e.g. a current signal) and the voltage V12 (e.g. a base-emitter voltage of the transistor Q122) can approximate a current-voltage (i.e. I-V) characteristic of a diode. Hence, when the temperature increases, the voltage V12 decreases, and the result signal IT increases. Since the power indication signal Spd (e.g. a voltage signal) can approximate a product of the result signal IT and a resistance of the resistor R124, a larger result signal IT can lead to a larger voltage drop across the resistor R124. Hence, the increase of the voltage level of the power indication signal Spd can compensate the decrease of the voltage level of the power indication signal Spd when temperature rises. In other words, the temperature compensation is performed to stabilize the power indication signal Spd when the temperature varies.

Figure 13:
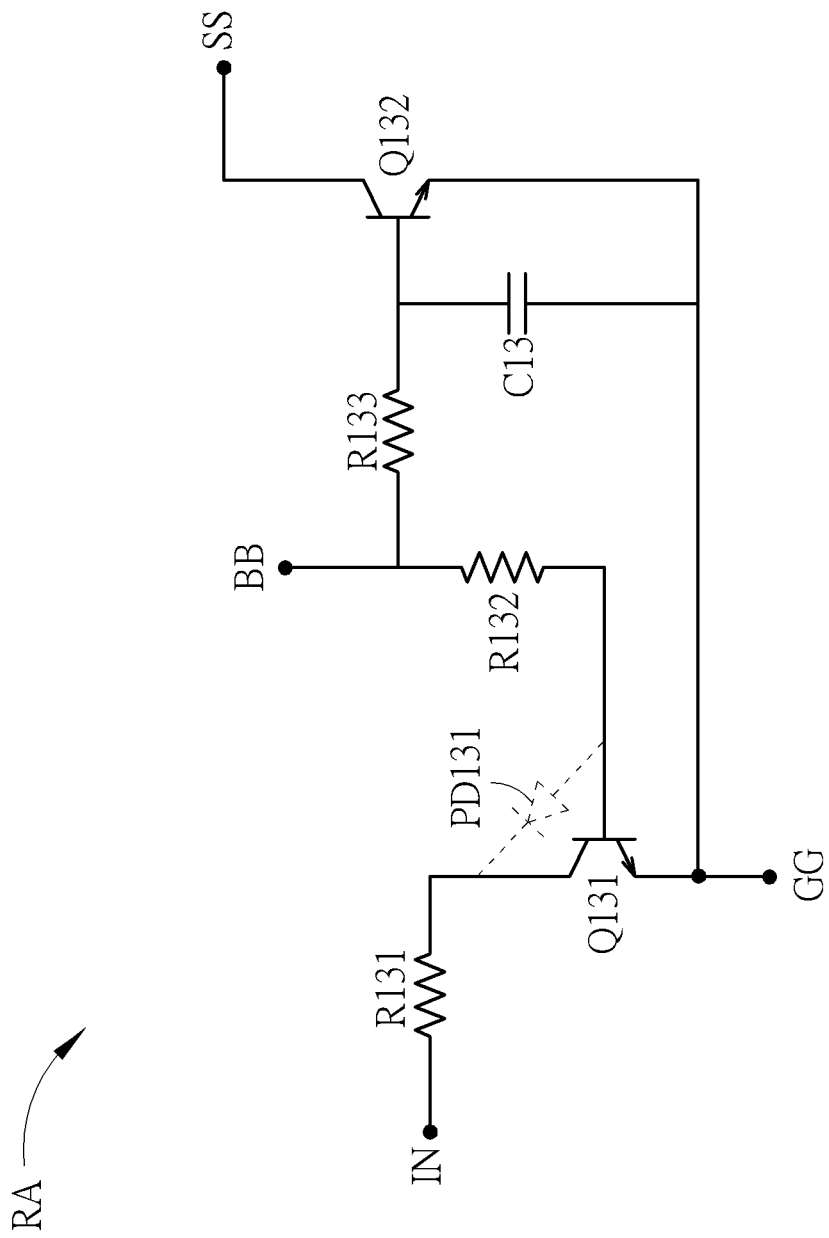
FIG. 13 illustrates an operation unit according to an embodiment.

Regarding the operation units RA1 to RA3 of FIG. 9 and RA111 to RA113 of FIG. 11, each of the operation units (denoted as RA) can be shown as FIG. 13. FIG. 13 illustrates an operation unit RA according to an embodiment. The operation unit RA can include resistors R131, R132 and R133, transistors Q131 and Q132, and a capacitor C13. The transistor Q131 can include a first terminal, a control terminal, and a second terminal coupled to the fourth terminal GG of the operation unit RA. The resistor R131 can include a first terminal coupled to the first terminal IN of the operation unit RA, and a second terminal coupled to the first terminal of the transistor Q131. The resistor R132 can include a first terminal coupled to the third terminal BB of the operation unit RA, and a second terminal coupled to the control terminal of the transistor Q131. The transistor Q132 can include a first terminal, a second terminal and a control terminal, where the first terminal is coupled to the second terminal SS of the operation unit RA, and the second terminal is coupled to the fourth terminal GG of the operation unit RA. The resistor R133 can include a first terminal coupled to the third terminal BB, and a second terminal coupled to the control terminal of the transistor Q132. The capacitor C13 can include a first terminal coupled to the control terminal of the transistor Q132, and a second terminal coupled to the second terminal of the transistor Q132. As shown in FIG. 13, there can be a parasitic diode PD131 formed between the first terminal and the control terminal of the transistor Q131. The parasitic diode PD131 can function as a rectifier. The transistor Q131 can provide a bias voltage to the transistor Q132. The transistor Q132 can operate as an amplifier. Hence, the operation unit RA can be a rectifying and amplifying circuit.

FIG. 14, FIG. 15 and FIG. 16 illustrate waveforms of a signal processed by the impedance unit 120 of FIG. 2 according to an embodiment. The impedance unit 120 can be a rectifying and filtering circuit. A radio-frequency signal can be as shown in FIG. 14. After being half-wave rectified, the signal of FIG. 14 can be as shown in FIG. 15. If the signal in FIG. 15 is further filtered, an envelope signal as shown in FIG. 16 can be obtained.

Figure 17:
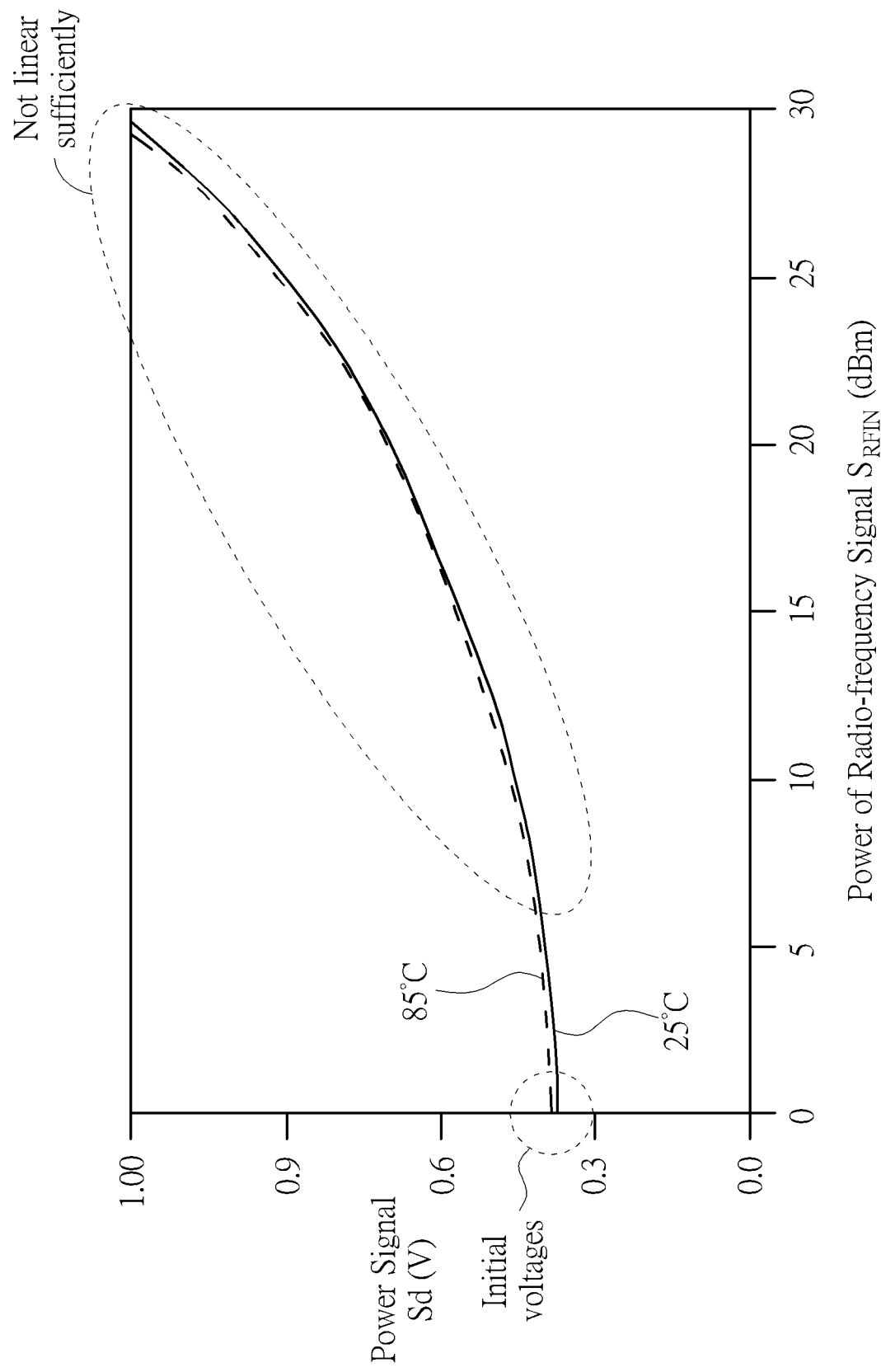
FIG. 17 illustrates a curve diagram according to an embodiment.

FIG. 17 illustrates a curve diagram according to an embodiment. Regarding FIG. 17 and FIG. 2, the horizontal axis of FIG. 17 is related to the power of the radio-frequency signal $S_{RFIN}$, and the vertical axis of FIG. 17 is related to the voltage level of the power signal Sd generated by the impedance unit 120. In the power range of 5 dBm to 30 dBm, the curve has a higher curvature as shown in FIG. 17, making it more difficult to measure the power of the radio-frequency signal $S_{RFIN}$ by measuring the voltage level of power signal Sd. As mentioned above, since the current mirror in the impedance unit 120 can perform temperature compensation, the curve related to 25° C. is close to the curve related to 85° C. as shown in FIG. 17.

FIG. 18 illustrates a curve diagram according to an embodiment. Regarding FIG. 18 and FIG. 2, the horizontal axis of FIG. 18 is related to the power of the radio-frequency signal $S_{RFIN}$, and the vertical axis of FIG. 18 is related to the voltage level of the power indication signal Spd generated by the log power detector 130. In the power range of 5 dBm to 30 dBm, the curve has a lower curvature in FIG. 18, making it easier to measure the power of the radio-frequency signal $S_{RFIN}$ by measuring the voltage level of the power indication signal Spd.

In summary, by means of the amplification devices 100 and 200 provided by embodiments, the problems caused by insertion loss, loading effect and insufficiency of linearity are reduced with a smaller die size, and the power of the signal inputted to the amplification unit 110 is better measured by observing the signal level of the power indication signal Spd generated by the low power detector 130.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An amplification device, comprising:
    an amplification unit comprising an input terminal configured to receive a radio-frequency signal, an output terminal configured to output an amplified radio-frequency signal, and a detected terminal configured to output a detected signal related to the radio-frequency signal;
    an impedance unit configured to provide an impedance, the impedance unit comprising an input terminal coupled to the detected terminal of the amplification unit and configured to receive the detected signal, and an output terminal configured to output a power signal; and
    a log power detector configured to generate a power indication signal according to the power signal, the log power detector comprising an input terminal coupled to the output terminal of the impedance unit, and an output terminal configured to output the power indication signal;
    wherein the log power detector has a parallel structure, and an impedance of the impedance unit is 5 to 7 times an impedance of the amplification unit.

2. The amplification device of claim 1, wherein the amplification unit further comprises n amplifiers coupled in series, an input terminal of a first amplifier of the n amplifiers is the input terminal of the amplification unit, an output terminal of an $n^{th}$ amplifier of the n amplifiers is the output terminal of the amplification unit, one of an input terminal and the output terminal of the $n^{th}$ amplifier of the n amplifiers is coupled to the detected terminal of the amplification unit, wherein n is an integer larger than 1.

3. An amplification device, comprising:
    an amplification unit comprising an input terminal configured to receive a radio-frequency signal, an output terminal configured to output an amplified radio-frequency signal, and a detected terminal configured to output a detected signal related to the radio-frequency signal;
    an impedance unit configured to provide an impedance, the impedance unit comprising an input terminal coupled to the detected terminal of the amplification unit and configured to receive the detected signal, an output terminal configured to output a power signal, and a diode comprising an input terminal and an output terminal; and
    a log power detector configured to generate a power indication signal according to the power signal, the log power detector comprising an input terminal coupled to the output terminal of the impedance unit, and an output terminal configured to output the power indication signal;
    wherein the log power detector has a parallel structure.

4. The amplification device of claim 3, wherein the impedance unit further comprises:
    a phase shifter comprising an input terminal coupled to the input terminal of the impedance unit, and an output terminal coupled to the input terminal of the diode.

5. The amplification device of claim 3, wherein the impedance unit further comprises:
    a phase shifter comprising an input terminal coupled to the output terminal of the diode, and an output terminal coupled to the output terminal of the impedance unit.

6. The amplification device of claim 3, wherein the impedance unit further comprises:
    an amplifier comprising an input terminal coupled to the input terminal of the impedance unit, and an output terminal coupled to the input terminal of the diode.

7. The amplification device of claim 3, wherein the impedance unit further comprises:
    an amplifier comprising an input terminal coupled to the output terminal of the diode, and an output terminal coupled to the output terminal of the impedance unit.

8. The amplification device of claim 3, wherein the diode of the impedance unit further comprises:

a first transistor comprising a first terminal, a second terminal, and a control terminal coupled to the first terminal of the first transistor; and a second transistor comprising a first terminal, a second terminal, and a control terminal coupled to the control terminal of the first transistor and the input terminal of the diode.

9. The amplification device of claim 8, wherein each of the first transistor and the second transistor is a bipolar transistor or a metal-oxide-semiconductor field-effect transistor.

10. The amplification device of claim 8, wherein the output terminal of the diode is coupled to one of the first terminal and the second terminal of the second transistor.

11. The amplification device of claim 8, wherein the diode of the impedance unit further comprises:

a first resister comprising a first terminal, and a second terminal coupled to the first terminal of the first transistor;

a second resistor comprising a first terminal coupled to the second terminal of the first transistor, and a second terminal;

a third resistor comprising a first terminal coupled to the first terminal of the first resistor, and a second terminal coupled to the first terminal of the second transistor;

a fourth resistor comprising a first terminal coupled to the second terminal of the second transistor, and a second terminal; and a first capacitor comprising a first terminal coupled to the input terminal of the diode, and a second terminal coupled to the control terminal of the second transistor.

12. The amplification device of claim 11, wherein the diode of the impedance unit further comprises:

a fifth resistor comprising a first terminal coupled to the input terminal of the diode and a second terminal coupled to the first terminal of the first capacitor.

13. The amplification device of claim 1, wherein the impedance unit further comprises a unity-gain amplifier.

14. An amplification device, comprising:

an amplification unit comprising an input terminal configured to receive a radio-frequency signal, an output terminal configured to output an amplified radio-frequency signal, and a detected terminal configured to output a detected signal related to the radio-frequency signal;

an impedance unit configured to provide an impedance, the impedance unit comprising an input terminal coupled to the detected terminal of the amplification unit and configured to receive the detected signal, and an output terminal configured to output a power signal; and a log power detector configured to generate a power indication signal according to the power signal, the log power detector comprising an input terminal coupled to the output terminal of the impedance unit, and an output terminal configured to output the power indication signal;

wherein the log power detector has a cascade structure; and wherein the impedance unit further comprises:

a diode comprising an input terminal and an output terminal.

15. The amplification device of claim 1, wherein the log power detector further comprises:

a first attenuation circuit configured to attenuate the power signal in a first power range, and comprising a first terminal coupled to the input terminal of the log power detector, and a second terminal;

a first operation unit comprising a first terminal coupled to the second terminal of the first attenuation circuit, and a second terminal;

a second attenuation circuit configured to attenuate the power signal in a second power range, and comprising a first terminal coupled to the input terminal of the log power detector, and a second terminal; and a second operation unit, comprising a first terminal coupled to the second terminal of the second attenuation circuit, and a second terminal;

wherein the parallel structure of the log power detector comprises at least the first attenuation circuit, the first operation unit, the second attenuation circuit and the second operation unit.

16. The amplification device of claim 15, wherein the log power detector further comprises:

an adder comprising a first terminal, a second terminal configured to output a result signal, and a control terminal coupled to the second terminal of the first operation unit and the second terminal of the second operation unit; and a current-to-voltage circuit configured to convert the result signal to generate the power indication signal, and comprising a first terminal coupled to the second terminal of the adder and the output terminal of the log power detector, and a second terminal;

wherein the result signal is a current signal, and the power indication signal is a voltage signal.

17. The amplification device of claim 16, wherein:

the adder comprises a transistor comprising a first terminal coupled to the first terminal of the adder, a second terminal coupled to the second terminal of the adder, and a control terminal coupled to the control terminal of the adder; and the current-to-voltage circuit comprises a resistor comprising a first terminal coupled to the first terminal of the current-to-voltage circuit, and a second terminal coupled to the second terminal of the current-to-voltage circuit.

18. The amplification device of claim 1, wherein a first impedance looking towards the input terminal of the impedance unit is higher than a second impedance looking towards the input terminal of the log power detector.

19. The amplification device of claim 1, wherein the detected terminal of the amplification unit is electrically connected to the input terminal of the impedance unit directly through a conductive path.

* * * * *